(12) United States Patent
Odani et al.

(10) Patent No.: US 9,376,337 B2
(45) Date of Patent: Jun. 28, 2016

(54) METHOD FOR PRODUCING GLASS SHEET WITH BENT PORTION AND GLASS SHEET WITH BENT PORTION

(71) Applicant: NIPPON ELECTRIC GLASS CO., LTD., Otsu-shi, Shiga (JP)

(72) Inventors: Osamu Odani, Otsu (JP); Masayuki Ikemoto, Otsu (JP); Masahiro Kobayashi, Otsu (JP); Tomoya Iwakoshi, Otsu (JP); Masanori Wada, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 13/916,686

(22) Filed: Jun. 13, 2013

(65) Prior Publication Data

US 2013/0337224 A1 Dec. 19, 2013

(30) Foreign Application Priority Data

Jun. 14, 2012 (JP) .................................. 2012-134453
Aug. 1, 2012 (JP) .................................. 2012-170995
Dec. 18, 2012 (JP) .................................. 2012-275303
May 22, 2013 (JP) .................................. 2013-108162

(51) Int. Cl.
*C03B 23/00* (2006.01)
*C03B 23/023* (2006.01)
*H05K 5/03* (2006.01)
(Continued)

(52) U.S. Cl.
CPC ......... *C03B 23/0066* (2013.01); *C03B 23/0256* (2013.01); *C03B 23/0258* (2013.01); *C03B 23/0302* (2013.01); *C03B 23/0307* (2013.01); *C03B 40/005* (2013.01); *G06F 1/1626* (2013.01); *G06F 1/1637* (2013.01);
(Continued)

(58) Field of Classification Search
CPC ............ C03B 23/0235; C03B 23/0258; C03B 23/0307
USPC ............................ 65/102, 103, 106, 107, 319
See application file for complete search history.

(56) References Cited

U.S. PATENT DOCUMENTS 4,081,263 A * 3/1978 Mestre ................ C03B 23/0256
65/106
4,229,200 A * 10/1980 Seymour ............. C03B 23/0256
65/104
(Continued)

FOREIGN PATENT DOCUMENTS

JP 61-227931 A 10/1986
JP 61-227932 A 10/1986
(Continued)

OTHER PUBLICATIONS

Official Communication issued in corresponding Japanese Patent Application No. 2013-115037, mailed on Jun. 25, 2013.
(Continued)

*Primary Examiner* — Jason L Lazorcik
(74) *Attorney, Agent, or Firm* — Keating and Bennett, LLP (57) ABSTRACT

Provided is a method capable of producing a glass sheet with a bent portion in which a flattened portion has high flatness and high smoothness. A flat glass sheet 20 is radiationally heated with a first portion 21 thereof held between first and second heat-insulating members 31, 32. And then, a second portion 22a, 22b of the flat glass sheet 20 not held between the first and second heat-insulating members 31, 32 is bent.

7 Claims, 5 Drawing Sheets (51) Int. Cl.
- *C03B 40/00* (2006.01)
- *C03B 23/025* (2006.01)
- *C03B 23/03* (2006.01)
- *G06F 1/16* (2006.01)
- *H04M 1/02* (2006.01)

(52) U.S. Cl.
CPC ............... *H04M1/0266* (2013.01); *H05K 5/03* (2013.01); *Y10T 428/24264* (2015.01)

(56) References Cited

U.S. PATENT DOCUMENTS

| | | | | |
|---|---|---|---|---|
| 4,720,296 | A * | 1/1988 | Bartusel | C03B 23/0357 65/106 |
| 4,891,055 | A * | 1/1990 | Shibaoka | C03B 23/0258 65/104 |
| 5,053,069 | A * | 10/1991 | Vanaschen | C03B 23/0235 65/106 |
| 5,176,733 | A * | 1/1993 | Koss | C03B 23/0258 65/107 |
| 5,755,845 | A * | 5/1998 | Woodward | C03B 23/0357 65/102 |
| 6,182,472 | B1 | 2/2001 | Fredholm et al. | |
| 7,000,430 | B1 | 2/2006 | Fotheringham et al. | |
| 8,397,540 | B2 * | 3/2013 | Dannoux et al. | 65/291 |
| 2002/0116951 | A1 * | 8/2002 | Dunifon | C03B 23/0307 65/106 |
| 2004/0206123 | A1 * | 10/2004 | Fotheringham | C03B 23/0258 65/103 |
| 2009/0217704 | A1 | 9/2009 | Shiraishi et al. | |
| 2010/0077798 | A1 | 4/2010 | Fredholm et al. | |
| 2010/0126222 | A1 * | 5/2010 | Dannoux | C03B 21/04 65/105 |
| 2010/0140848 | A1 * | 6/2010 | Provence | B29C 53/04 264/339 |
| 2010/0300152 | A1 * | 12/2010 | Dannoux | C03B 23/0305 65/66 |
| 2011/0067450 | A1 * | 3/2011 | Fredholm | C03B 21/02 65/81 |
| 2011/0205485 | A1 * | 8/2011 | Sonzogni | B29C 43/3642 351/124 |
| 2012/0114901 | A1 * | 5/2012 | Uraji | B32B 1/00 428/121 |
| 2012/0131961 | A1 * | 5/2012 | Dannoux | C03B 23/0235 65/103 |
| 2012/0135852 | A1 * | 5/2012 | Ellison | C03C 3/091 501/66 |
| 2012/0279257 | A1 * | 11/2012 | Dannoux | C03B 23/0256 65/103 |
| 2013/0086948 | A1 * | 4/2013 | Bisson | C03B 23/0258 65/106 |
| 2013/0125592 | A1 * | 5/2013 | Bisson | C03B 23/0258 65/273 |
| 2013/0171425 | A1 * | 7/2013 | Wang | B44C 1/227 428/172 |
| 2013/0329346 | A1 * | 12/2013 | Dannoux | C03B 23/0235 361/679.01 |
| 2014/0144182 | A1 * | 5/2014 | Dannoux | C03B 23/0256 65/103 |
| 2014/0162029 | A1 * | 6/2014 | Takeuchi | C03B 23/0235 428/174 |
| 2014/0234581 | A1 * | 8/2014 | Immerman | C03B 23/0357 428/141 |
| 2014/0335322 | A1 * | 11/2014 | Luo | C03B 23/0307 428/177 |
| 2015/0251943 | A1 * | 9/2015 | Wada | C03B 23/0307 428/130 |
| 2015/0274570 | A1 * | 10/2015 | Wada | C03B 23/03 65/106 |
| 2015/0274572 | A1 * | 10/2015 | Wada | C03B 23/0307 65/106 |

FOREIGN PATENT DOCUMENTS

| | | |
|---|---|---|
| JP | 62-212237 A | 9/1987 |
| JP | 01-122931 A | 5/1989 |
| JP | 01-122932 A | 5/1989 |
| JP | 01-242428 A | 9/1989 |
| JP | 06-048752 A | 2/1994 |
| JP | 11-322353 | 11/1999 |
| JP | 2002-540048 A | 11/2002 |
| JP | 2003-502257 A | 1/2003 |
| JP | 2004-035381 A | 2/2004 |
| JP | 2010-030859 A | 2/2010 |
| WO | 00/76924 A1 | 12/2000 |
| WO | 2005/042420 A1 | 5/2005 |
| WO | 2012/030751 A2 | 3/2012 |
| WO | 2013/055589 A2 | 4/2013 |
| WO | 2013/055861 A1 | 4/2013 |

OTHER PUBLICATIONS

Official Communication issued in corresponding European Patent Application No. 13803490.5, mailed on Mar. 31, 2016.

* cited by examiner

METHOD FOR PRODUCING GLASS SHEET WITH BENT PORTION AND GLASS SHEET WITH BENT PORTION

TECHNICAL FIELD

This invention relates to a method for producing a glass sheet with a bent portion and a glass sheet with a bent portion.

BACKGROUND ART

In recent years, mobile flat panel displays, such as smartphones and tablet personal computers (tablet PCs), are rapidly spreading. Generally, a glass sheet is used as a front surface layer of a mobile flat panel display.

CITATION LIST

Patent Literature

Patent Literature 1: JP-A-2010-30859

SUMMARY OF INVENTION

Technical Problem

For purposes of esthetic improvement and the like of the mobile flat panel display, there is, for example, a demand to cover the front and side surfaces of the mobile flat panel display with a single glass sheet. In such a case, a glass sheet having at least one flattened portion and bent portions is necessary.

A conceivable method for producing a glass sheet with a bent portion is a method of press-forming a flat glass sheet as described in, for example, Patent Literature 1. However, press forming is performed by heating the entire flat glass sheet to its softening point or above and pressing the entire glass sheet using forming dies, so that the flattened portion of the resultant glass sheet may be likely to have low flatness and low smoothness.

A principal object of the present invention is to provide a method capable of producing a glass sheet with a bent portion in which a flattened portion has high flatness and high smoothness.

Solution to Problem

A method for producing a glass sheet with a bent portion according to the present invention is directed to a method for producing a glass sheet including a flattened portion and a bent portion continued to the flattened portion. In the method for producing a glass sheet with a bent portion according to the present invention, a flat glass sheet is radiationally heated with a first portion of the flat glass sheet held between first and second heat-insulating members. And then, a second portion of the flat glass sheet not held between the first and second heat-insulating members is bent.

In the method for producing a glass sheet with a bent portion according to the present invention, the flat glass sheet is preferably heated so that the first portion thereof has a temperature below the softening point of the flat glass sheet.

In the method for producing a glass sheet with a bent portion according to the present invention, the flat glass sheet is preferably heated so that the second portion of the flat glass sheet reaches a higher temperature than the first portion thereof.

In the method for producing a glass sheet with a bent portion according to the present invention, an entire region of the second portion is preferably heated.

In the method for producing a glass sheet with a bent portion according to the present invention, the flat glass sheet used is preferably a flat glass sheet having a linear coefficient of thermal expansion of $120 \times 10^{-7}/°$ C. or less at 30° C. to 380° C.

In the method for producing a glass sheet with a bent portion according to the present invention, it is preferred that the heat-insulating member include a through hole and the heating and bending be performed while a coolant is fed through the through hole.

In the method for producing a glass sheet with a bent portion according to the present invention, the heat-insulating members preferably have a lower thermal conductivity than the flat glass sheet.

In the method for producing a glass sheet with a bent portion according to the present invention, the heat-insulating members are preferably formed of ceramic material.

The second portion is preferably bent with the flat glass sheet pressed by the first and second heat-insulating members.

A glass sheet with a bent portion according to the present invention includes: a flattened portion substantially in the shape of a flat sheet; and a bent portion continued to an end region of the flattened portion in a transverse direction thereof. When viewed in cross section along a thickness direction of the glass sheet, no gap is created between an imaginary line tangent to a back surface of a middle region of the flattened portion in the transverse direction and the end region of the flattened portion in the transverse direction.

Front and back surfaces of the flattened portion are preferably unground surfaces.

A front surface of the end region of the flattened portion in the transverse direction is preferably flush with a front surface of the middle region of the flattened portion in the transverse direction.

The end region of the flattened portion in the transverse direction may be provided to extend along a direction inclined toward a bent-away side of the bent portion relative to a direction of extension of the middle region of the flattened portion in the transverse direction.

The back surface of the flattened portion may be formed of a curved surface having a radius of curvature of 1000 mm or more.

The glass sheet with a bent portion according to the present invention may further includes a flange continued to an opposite end of the bent portion to the flattened portion and having a shape of a substantially flat sheet. In this case, the angle formed between a direction of extension of a back surface of the flange and a direction of extension of a back surface of the end region of the flattened portion in the transverse direction may be larger than 90°.

Advantageous Effects of Invention

The present invention can provide a method capable of producing a glass sheet with a bent portion in which a flattened portion has high flatness and high smoothness.

DESCRIPTION OF EMBODIMENTS

Hereinafter, a description will be given of an exemplary preferred embodiment for working of the present invention. However, the following embodiment is merely illustrative. The present invention is not at all limited to the following embodiment.

Throughout the drawings to which the embodiment and the like refer, elements having substantially the same functions will be referred to by the same reference signs. The drawings to which the embodiment and the like refer are schematically illustrated. The dimensional ratios and the like of objects illustrated in the drawings may be different from those of the actual objects. Different drawings may have different dimensional ratios and the like of the objects. Dimensional ratios and the like of specific objects should be determined in consideration of the following descriptions.

Figure 1:
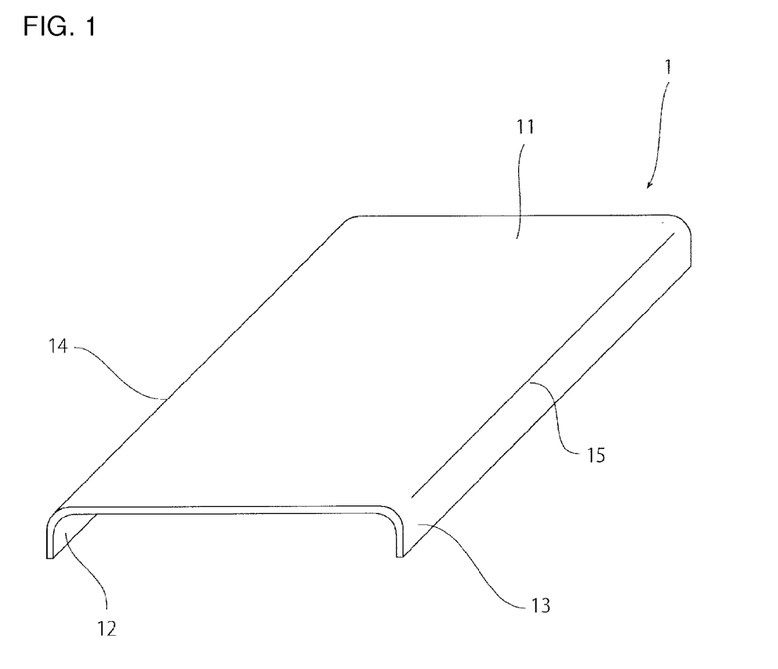
FIG. 1 is a schematic perspective view of a glass sheet with a bent portion, which has been produced in an embodiment of the present invention.

This embodiment relates to a method for producing a glass sheet 1 shown in FIG. 1. The glass sheet 1 includes first to third flattened portions 11 to 13 and first and second bent portions 14, 15. One edge of the first flattened portion 11 in the transverse direction thereof and the second flattened portion 12 are connected by the first bent portion 14. The other edge of the first flattened portion 11 in the transverse direction thereof and the third flattened portion 13 are connected by the second bent portion 15. The first and second bent portions 14, 15 may have a cross-sectional shape of, for example, an arc or an elliptic arc. The thickness of the first and second bent portions 14, 15 is preferably substantially equal to that of the first to third flattened portions 11 to 13.

No particular limitation is placed on the usage of the glass sheet 1. For example, the glass sheet 1 can be used as a housing of a mobile flat panel display, such as a smartphone or a tablet personal computer (tablet PC). In using the glass sheet 1 like this, the thickness of the glass sheet 1 can be, for example, about 0.2 mm to about 2 mm and preferably about 0.3 mm to about 1.8 mm.

Furthermore, if the glass sheet 1 is a mobile display glass cover for use in a mobile display, the surface roughness (Ra) of the outside surfaces of the bent portions 14, 15 and flattened portions 12, 13 located laterally of the mobile display body is preferably at least partly larger than the surface roughness (Ra) of the outside surface of the first flattened portion 11 located at the top of the display. In this case, the mobile display can be improved in graspability. From the viewpoint of further improving the graspability of the mobile display, the surface roughness (Ra) of at least part of the outside surfaces of the bent portions 14, 15 and the flattened portions 12, 13 is preferably equal to or more than 100 times the surface roughness (Ra) of the outside surface of the first flattened portion 11 and more preferably equal to or more than 200 times that surface roughness. Specifically, the surface roughness (Ra) of at least part of the outside surfaces of the bent portions 14, 15 and the flattened portions 12, 13 is preferably 0.5 µm or more and more preferably 0.8 µm or more. On the other hand, the surface roughness (Ra) of the first flattened portion 11 is preferably 0.01 µm or less and more preferably 0.008 µm or less. The surface roughness (Ra) used herein refers to the arithmetic mean roughness (Ra) defined in JIS B0601-2001.

Alternatively, the graspability of the mobile display may be improved by providing irregularities on at least part of the outside surfaces of the bent portions 14, 15 and the flattened portions 12, 13. In this case, the distance between the top and foot of the irregularities in the normal direction of the flattened portions 12, 13 is preferably 50 µm or more and more preferably 70 µm or more. The distance between the top and foot of the irregularities is preferably not more than ½ of the average thickness of the flattened portions 12, 13. Thus, the flattened portions 12, 13 can be improved in graspability while being prevented from decreasing in rigidity.

No particular limitation is placed on the shape of the irregularities. The irregularities may be linear or may be formed in the shape of a pyramid, a cone, a truncated pyramid, a prism or a column.

Furthermore, if irregularities are provided on at least part of the outside surfaces of the bent portions 14, 15 and the flattened portions 12, 13, it is not always necessary that the surface roughness (Ra) of at least part of the outside surfaces of the bent portions 14, 15 and the flattened portions 12, 13 is larger than the surface roughness (Ra) of the outside surface of the first flattened portion 11 located at the top of the display.

No particular limitation is placed on the composition of glass forming the glass sheet 1 and it can be appropriately selected depending upon the properties required for the glass sheet 1. The glass sheet 1 can be formed of, for example, silicate glass or borosilicate glass. More specifically, a glass sheet 1 can be used which has a composition, in % by mass, of 50 to 80% $SiO_2$, 5 to 25% $Al_2O_3$, 0 to 15% $B_2O_3$, 0 to 3.5% $Li_2O$, 1 to 20% $Na_2O$, 0 to 10% $K_2O$, 5 to 25% $Li_2O+Na_2O+K_2O$, 0 to 12% MgO, 0 to 10% CaO, 0 to 5% SrO, 0 to 5% BaO, 0 to 6% ZnO, 0 to 10% $ZrO_2$, 0 to 10% $P_2O_5$, and 0 to 3% $As_2O_3+Sb_2O_3+SnO_2+F+Cl+SO_3$.

Next, a description will be given of a method for producing the glass sheet 1 in this embodiment with reference mainly to FIGS. 2 and 3.

Figure 2:
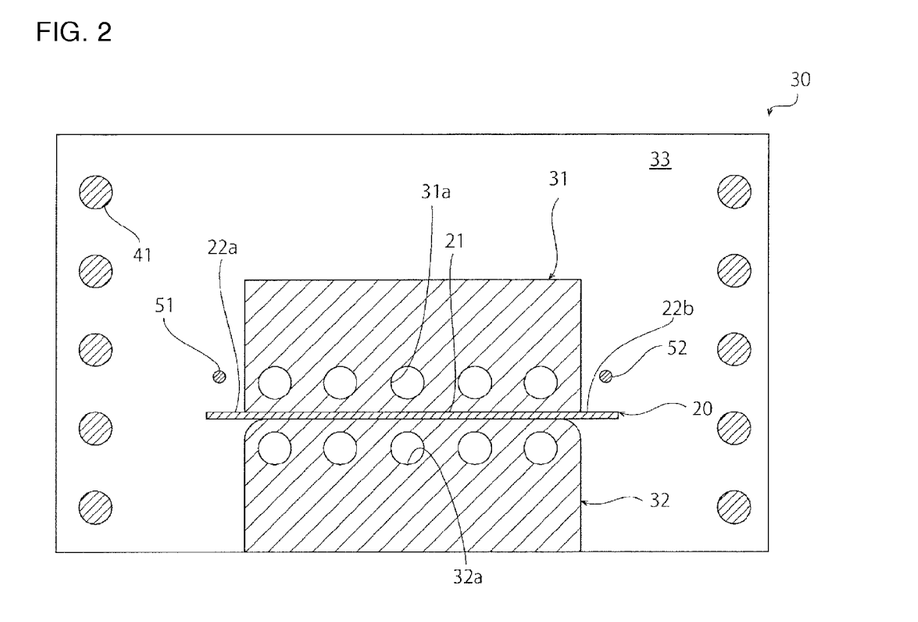
FIG. 2 is a schematic cross-sectional view for illustrating a production step for the glass sheet with the bent portion in the above embodiment of the present invention.

First, a flat glass sheet 20 shown in FIG. 2 is prepared. The flat glass sheet 20 is a glass sheet for use in forming a glass sheet 1. The thickness of the flat glass sheet 20 is substantially equal to the thickness of the glass sheet 1.

In this embodiment, the flat glass sheet 20 is radiationally heated with a first portion 21 thereof held between first and second heat-insulating members 31, 32. And then, second portions 22a, 22b of the flat glass sheet 20 not held between the first and second heat-insulating members 31, 32 are bent by pressing them using pressing tools 51, 52. Thus, a glass sheet 1 can be obtained which has bent portions 14, 15 formed at least partly of the second portions 22a, 22b, respectively, and a first flattened portion 11 formed of the first portion 21.

The method for producing the glass sheet 1 will be described in further detail below. First, a forming apparatus 30 for use in producing the glass sheet 1 is described.

The forming apparatus 30 includes a forming chamber 33. The forming chamber 33 is internally provided with a heater 41. The heater 41 radiates heat rays. Therefore, the forming apparatus 30 can radiationally heat an object placed in the forming chamber 33.

The first and second heat-insulating members 31, 32 are disposed in the forming chamber 33. The first and second heat-insulating members 31, 32 are members for reducing the transfer of radiation heat to the first portion 21 of the flat glass sheet 20. In order to reduce the transfer of radiation heat to the first portion 21 of the flat glass sheet 20, the first and second heat-insulating members 31, 32 preferably have a lower thermal conductivity than the flat glass sheet 20. Furthermore, the first and second heat-insulating members 31, 32 preferably block heat rays emitted from the heater 41. The first and second heat-insulating members 31, 32 can be formed of, for example, ceramic material containing as a major ingredient alumina, silicon carbide or diatomite.

Each of the heat-insulating members 31, 32 includes at least one through hole 31a, 32a. A coolant, such as air, is fed through these through holes 31a, 32a during heating and forming. Thus, the temperature of the heat-insulating members 31, 32 can be controlled. For example, an undesirable temperature rise of the heat-insulating members 31, 32 can be prevented.

In this embodiment, an example is described in which both the two heat-insulating members are provided with their respective through holes through which a coolant is to be fed. However, the present invention is not limited to this configuration. Only one of the two heat-insulating members may be provided with such a through hole or none of the two heat-insulating members may be provided with such a through hole.

In forming the flat glass sheet 20, first, the flat glass sheet 20 is placed between the first heat-insulating member 31 and the second heat-insulating member 32 and the first portion 21 of the flat glass sheet 20 is held between the first and second heat-insulating members 31, 32. Portions of the flat glass sheet 20 other than the first portion 21, which are not held between the first and second heat-insulating members 31, 32, form the second portions 22a, 22b.

With the first portion 21 of the flat glass sheet 20 held between the first and second heat-insulating members 31, 32, the heater 41 is actuated to radiationally heat the flat glass sheet 20 (heating step).

Figure 3:
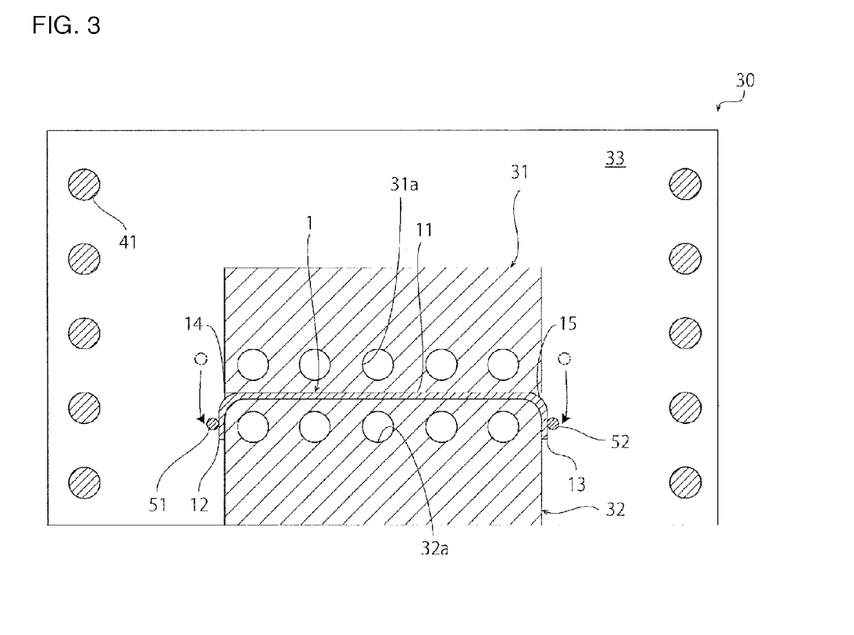
FIG. 3 is a schematic cross-sectional view for illustrating another production step for the glass sheet with the bent portion in the above embodiment of the present invention.

And then, as shown in FIG. 3, the second portions 22a, 22b are bent by pressing them using the pressing tools 51, 52 provided on both sides of the first and second heat-insulating members 31, 32 (forming step). Thus, the glass sheet 1 shown in FIG. 1 can be obtained.

No particular limitation is placed on the type of the pressing tools 51, 52 so long as they can appropriately press the flat glass sheet 20. Each pressing tool 51, 52 may be formed of, for example, a rod.

Alternatively, without use of the pressing tools 51, 52, the second portions 22a, 22b may be bent, for example, under their own weights.

As thus far described, in this embodiment, the flat glass sheet 20 is radiationally heated with the first portion 21 thereof held between the first and second heat-insulating members 31, 32. Therefore, the temperature rise of the first portion 21 can be reduced. Thus, it can be easily implemented to increase the temperature of the second portions 22a, 22b not held between the first and second heat-insulating members 31, 32 while reducing the temperature rise of the first portion 21. In addition, even if the second portions 22a, 22b reach a deformable temperature, the first portion 21 can be held at a low temperature so as not to change the surface condition. Hence, a glass sheet 1 can be produced in which the first flattened portion 11 has high flatness and high smoothness. Furthermore, since the first flattened portion 11 has high flatness and high smoothness, the front and back surfaces of the first flattened portion 11 can be unground surfaces. Thus, a glass sheet 1 having high mechanical strength can be produced.

From the viewpoint of reducing the strain of the flat glass sheet 20, the flat glass sheet 20 is preferably heated so that the first portion 21 thereof reaches a temperature equal to or higher than the strain point of the flat glass sheet 20. In addition, from the viewpoint of further increasing the flatness and smoothness of the first flattened portion 11, the flat glass sheet 20 is preferably heated so that the first portion 21 has a temperature below the softening point of the flat glass sheet 20 and, more preferably, the flat glass sheet 20 is heated so that the first portion 21 has a temperature equal to or lower than the glass transition point of the flat glass sheet 20 plus 100° C.

Furthermore, from the viewpoint of facilitating the bending of the second portions 22a, 22b, the flat glass sheet 20 is preferably heated so that the second portions 22a, 22b reach a higher temperature than the first portion 21.

Moreover, the entire regions of the second portions 22a, 22b are preferably heated. Thus, the second portions 22a, 22b can be bent, using the pressing tools 51, 52, at a relatively low temperature within a temperature range in which the flat glass sheet 20 can be deformed. Therefore, it can be prevented that indentations are produced on the second portions 22a, 22b by the pressing tools 51, 52.

Moreover, the time taken for the second portions 22a, 22b to reach a deformable temperature is shorter than the time for the first portion 21 to reach a temperature equal to or higher than the strain point of the flat glass sheet 20. Therefore, it is necessary to continue to heat the flat glass sheet 20 until the first portion 21 reaches a temperature equal to or higher than the strain point of the flat glass sheet 20.

Furthermore, it is preferred that a coolant be fed through the through holes 31a, 32a to reduce the temperature rise of the first and second heat-insulating members 31, 32. This makes it easy to heat the flat glass sheet 20 to avoid that the temperature of the first portion 21 is above the softening point of the flat glass sheet 20, and thus makes it easy to further increase the flatness and smoothness of the first flattened portion 11.

When a temperature difference is produced between the first portion 21 and the second portions 22a, 22b as in this embodiment, the first portion 21 becomes different in amount of thermal expansion from the second portions 22a, 22b. Specifically, the amount of thermal expansion of the first portion 21 becomes lower than that of the second portions 22a, 22b. Owing to this difference in amount of thermal expansion, the flat glass sheet 20 may cause distortion, such as warpage or waviness. Therefore, from the viewpoint of reducing the distortion of the flat glass sheet 20 to obtain a glass sheet 1 having a high shape accuracy, the flat glass sheet 20 preferably has a small coefficient of thermal expansion. Specifically, the linear coefficient of thermal expansion of the flat glass sheet 20 at 30° C. to 380° C. is preferably $120 \times 10^{-7}$/° C. or less, more preferably $105 \times 10^{-7}$/° C. or less, still more preferably $100 \times 10^{-7}$/° C. or less, even more preferably $90 \times 10^{-7}$/° C., particularly preferably $85 \times 10^{-7}$/° C., and most preferably $80 \times 10^{-7}$/° C.

Figure 4:
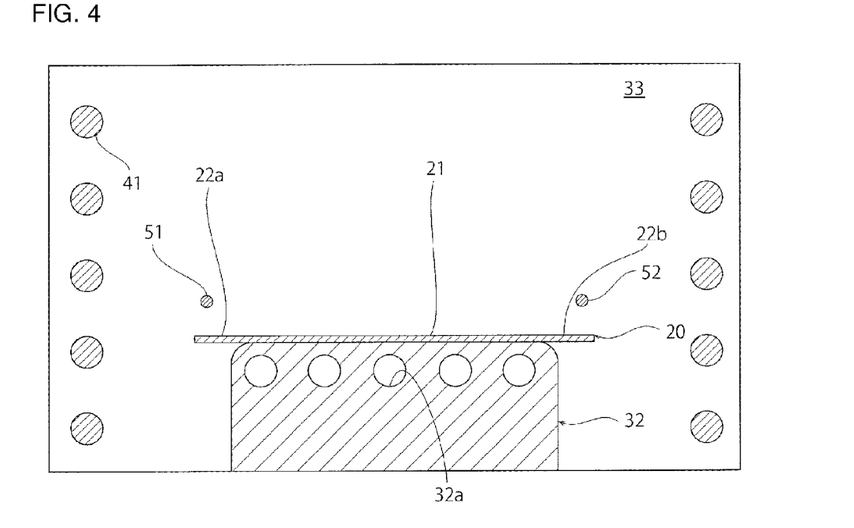
FIG. 4 is a schematic cross-sectional view for illustrating a production step for a glass sheet with a bent portion in a reference example.
Figure 5:
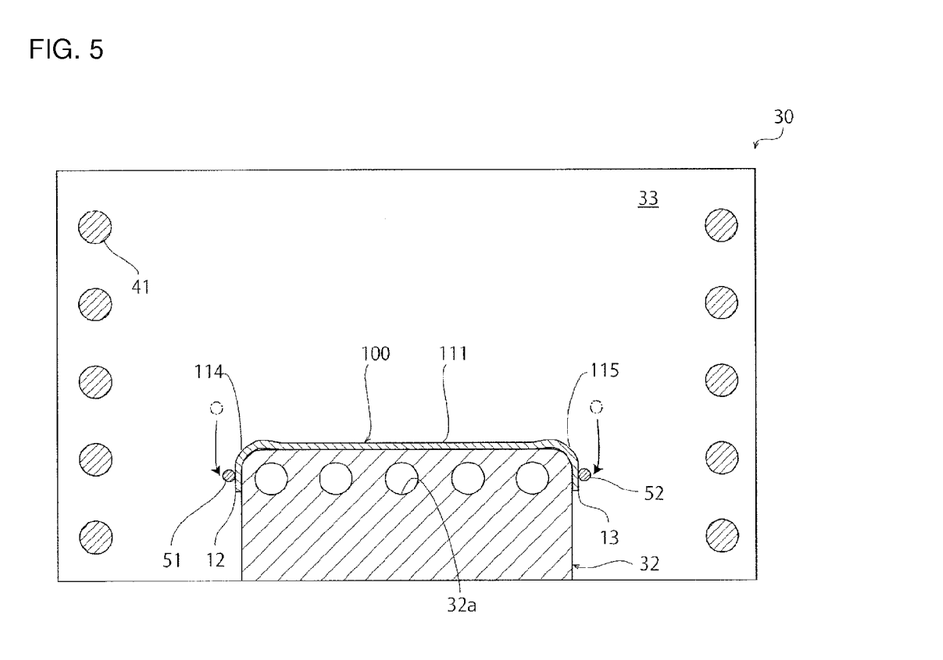
FIG. 5 is a schematic cross-sectional view of a glass sheet with a bent portion, which will be produced in the reference example.

For example, as shown in FIG. 4, it is conceivable that without use of the first heat-insulating member 31, the flat glass sheet 20 placed on the second heat-insulating member 32 is bent using the pressing tools 51, 52. In this case, however, the flat glass sheet 20 will not be given a shape fully conforming to the second heat-insulating member 32, because of the rigidity of the flat glass sheet 20. Specifically, as shown in FIG. 5, the flat glass sheet 20 will be given a shape in which the ends of the first flattened portion 111 next to the bent portions 114, 115 are raised from the second heat-insulating member 32. If the flat glass sheet 20 is given a shape in which the ends of the first flattened portion 111 next to the bent portions 114, 115 are raised from the second heat-insulating member 32, and when the resultant glass sheet 100 is used as a display and the ends of the first flattened portion 111 are located in the display region, the display quality of the display will be decreased. On the other hand, when the ends of the first flattened portion 111 are located outside the display region, the area ratio of the display region in the display will be decreased.

Figure 6:
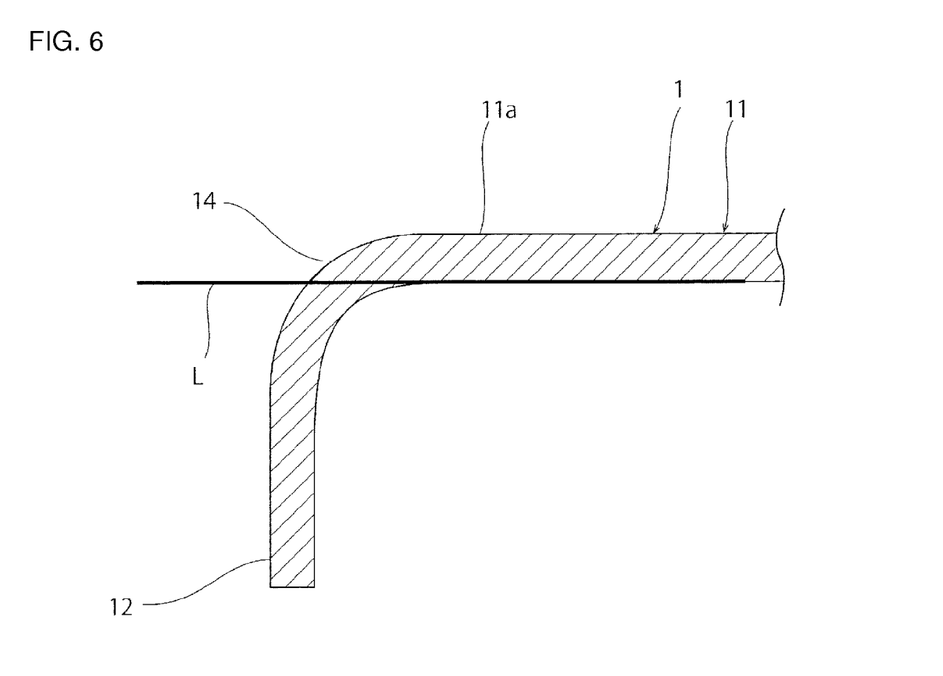
FIG. 6 is a schematic cross-sectional view of part of the glass sheet with the bent portion, which has been produced in the above embodiment of the present invention.

In contrast, in this embodiment, the second portions 22a, 22b of the flat glass sheet 20 are bent with the first portion 21 thereof held between the first and second heat-insulating members 31, 32. Therefore, the temperature rise of the first portion 21 is reduced. The first portion 21 is less likely to reach a deformable temperature. In addition, the deformation of the first portion 21 is restricted by the first and second heat-insulating members 31, 32. Therefore, the first portion 21 can be held in a shape conforming to the second heat-insulating member 32. Thus, as shown in FIG. 6, when viewed in cross section along the thickness direction, no gap is created between the imaginary line L tangent to the back surface of a middle region of the first flattened portion 11 in the transverse direction and end regions 11a of the first flattened portion 11 in the transverse direction. The back surface of the middle region of the first flattened portion 11 in the transverse direction is substantially flush with the back surfaces of the end regions 11a. Furthermore, the front surface of the middle region of the first flattened portion 11 in the transverse direction is substantially flush with the front surfaces of the end regions 11a. In addition, the first flattened portion 11 has high flatness and high smoothness and, therefore, the front and back surfaces of the first flattened portion 11 can be unground surfaces. Thus, a glass sheet 1 having high mechanical strength can be provided. Hence, in the case of using the glass sheet 1 as a display, a display can be obtained which has high mechanical strength and in which even if the end regions 11a of the first flattened portion 11 are located in the display region, the display quality is less likely to be decreased and superior and the area ratio of the display region is high.

Figure 7:
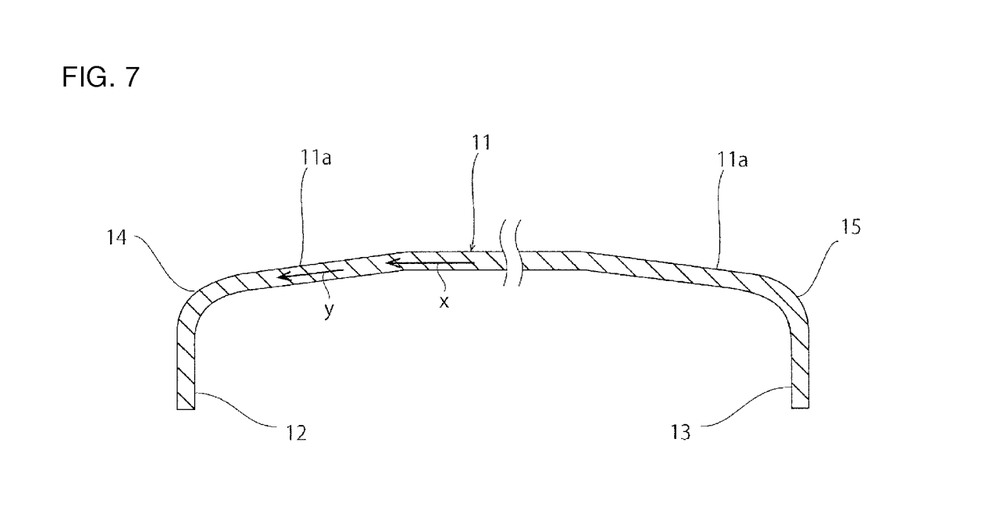
FIG. 7 is a schematic cross-sectional view of a glass sheet with a bent portion according to a first modification.

From the viewpoint of more reliably avoiding the creation of a gap between the imaginary line L and the end regions 11a of the first flattened portion 11 in the transverse direction, the shape of the second heat-insulating member 32 is preferably made different from that in the above embodiment and, for example, as shown in FIG. 7, each end region 11a of the first flattened portion 11 in the transverse direction is preferably provided to extend along a direction inclined toward a bent-away side of the associated bent portion 14, 15 (along the direction y inclined downward in FIG. 7) relative to the direction x of extension of the middle region of the first flattened portion 11 in the transverse direction. The angle formed between the directions x and y is preferably 178° to 180° and more preferably 179° to 180°. If the angle formed between the directions x and y is too large, this makes it less likely to achieve the effect of more reliably avoiding the creation of a gap between the imaginary line L and the end regions 11a of the first flattened portion 11 in the transverse direction. If the angle formed between the directions x and y is too small, the resultant glass sheet may be inadequate for use as a display.

Figure 8:
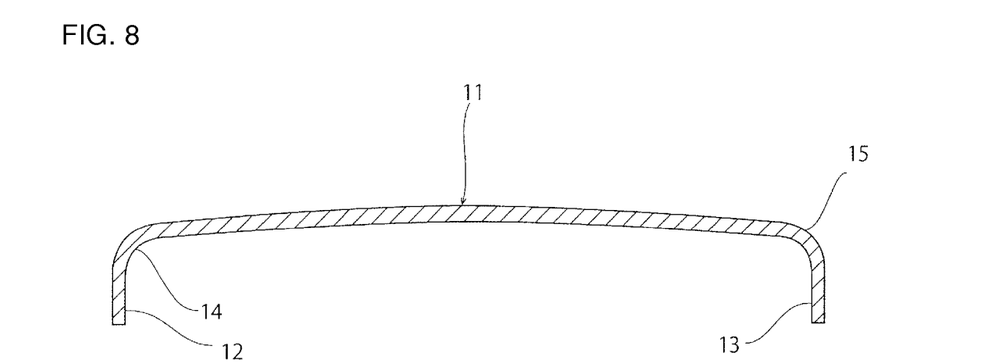
FIG. 8 is a schematic cross-sectional view of a glass sheet with a bent portion according to a second modification.

Furthermore, from the viewpoint of more reliably avoiding the creation of a gap between the imaginary line L and the end regions 11a of the first flattened portion 11 in the transverse direction, the shape of the second heat-insulating member 32 is preferably made different from that in the above embodiment and, for example, as shown in FIG. 8, the back surface of the first flattened portion 11 is preferably formed of a gently curved surface raised opposite to the direction of extension of the second and third flattened portions 12, 13 and having a radius of curvature of not less than 1000 mm and more preferably not less than 5000 mm. However, if the radius of curvature of the back surface of the first flattened portion 11 is too large, this may make it less likely to achieve the effect of more reliably avoiding the creation of a gap between the imaginary line L and the end regions 11a of the first flattened portion 11 in the transverse direction. Therefore, the radius of curvature of the back surface of the first flattened portion 11 is preferably not more than 10000 mm and more preferably not more than 6000 mm.

In the present invention, a surface having a radius of curvature of not less than 800 mm is considered as a flat surface and a sheet portion whose principal surface has a radius of curvature of not less than 800 mm is considered as a flattened portion.

Figure 9:
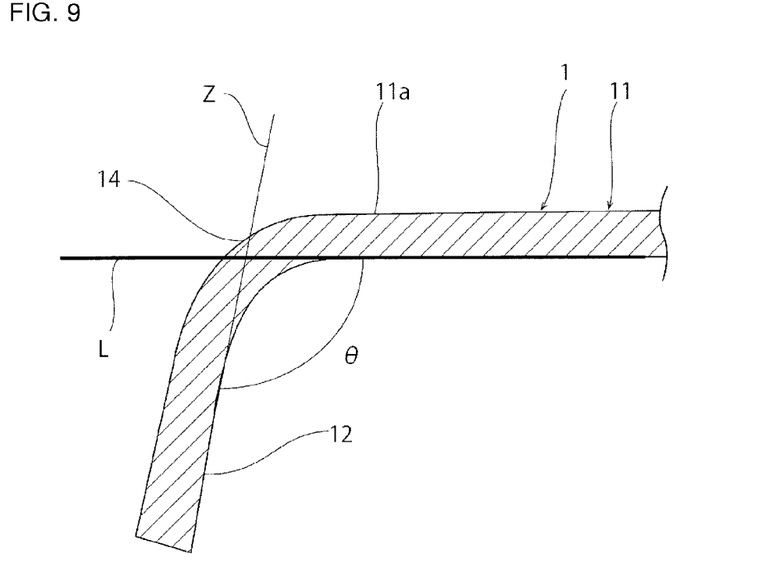
FIG. 9 is a schematic cross-sectional view of a glass sheet with a bent portion according to a third modification.

Moreover, from the viewpoint of more reliably avoiding the creation of a gap between the imaginary line L and the end regions 11a of the first flattened portion 11 in the transverse direction, the shape of the second heat-insulating member 32 is preferably made different from that in the above embodiment and, for example, as shown in FIG. 9, the angle θ formed between the direction of extension of each of the back surfaces of the flattened portions 12, 13 and the direction of extension of the back surface of the associated end region 11a of the first flattened portion 11 in the transverse direction (the angle formed between the tangent line Z of each of the back surfaces of the second and third flattened portion 12, 13 and the imaginary line L) is preferably larger than 90° and is more preferably 90.1° or more. However, if the angle formed between the direction of extension of each of the back surfaces of the flattened portions (flanges) 12, 13 and the direction of extension of the back surface of the associated end region 11a of the first flattened portion 11 in the transverse direction is too large, the resultant glass sheet may be inadequate for use as a display. Therefore, the angle formed between the direction of extension of each of the back surfaces of the flattened portions 12, 13 and the direction of extension of the back surface of the associated end region 11a of the first flattened portion 11 in the transverse direction is preferably not more than 95° and more preferably not more than 93°.

Figure 10:
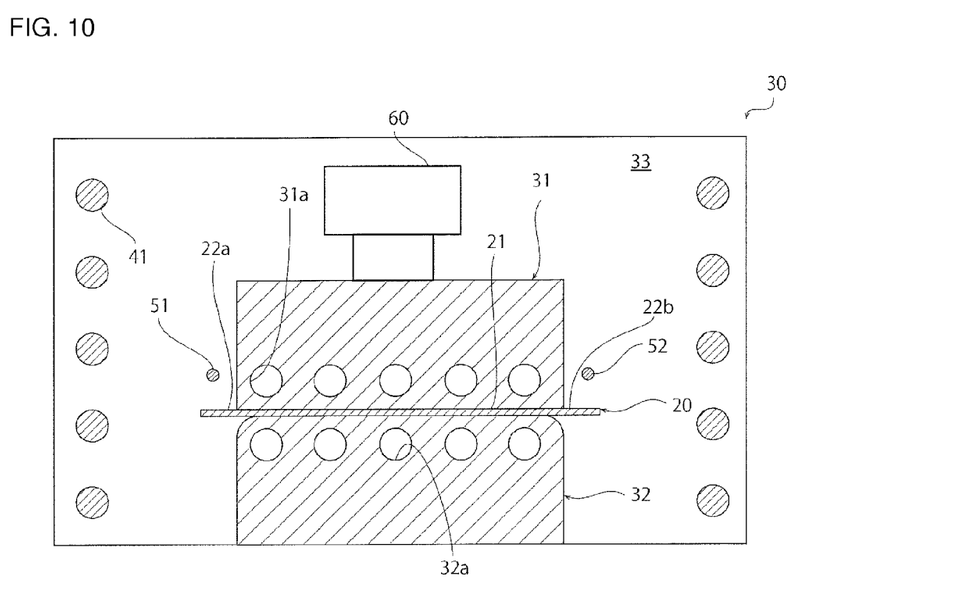
FIG. 10 is a schematic cross-sectional view for illustrating a production step for a glass sheet with a bent portion in a fourth modification.

Furthermore, from the viewpoint of more reliably avoiding the creation of a gap between the imaginary line L and the end regions 11a of the first flattened portion 11 in the transverse direction, it is preferred that, as shown in FIG. 10, a pressing mechanism 60 be provided and the second portions 22a, 22b be deformed with the flat glass sheet 20 pressed by the first and second heat-insulating members 31, 32.

From the viewpoint of increasing the flatness and smoothness of the second and third flattened portions 12, 13, the pressing tools 51, 52 are preferably made of a heat-insulating material, such as ceramic material. From the viewpoint of preventing breakage due to thermal shock, the pressing tools 51, 52 are preferably preheated to a temperature near the temperature of the flat glass sheet 20 prior to the pressing.

The shape of the bent portions 14, 15 is generally determined depending upon the shape of the corners of the second heat-insulating member 32. Therefore, the shape of the bent portions 14, 15 can be easily changed by appropriately changing the shape of the corners of the second heat-insulating member 32.

Although in the above embodiment an example has been described in which the first flattened portion 11 is provided on both sides with bent portions 14, 15, the present invention is not limited to this configuration. The glass sheet produced by the present invention may have a single bent portion.

REFERENCE SIGNS LIST

1 . . . glass sheet
11 . . . first flattened portion
11a . . . end region of first flattened portion
12 . . . second flattened portion
13 . . . third flattened portion
14 . . . first bent portion
15 . . . second bent portion
20 . . . flat glass sheet
21 . . . first portion
22a, 22b . . . second portion
30 . . . forming apparatus
31 . . . first heat-insulating member
32 . . . second heat-insulating member
31a, 32a . . . through hole
33 . . . forming chamber
4 1 . . . heater
51, 52 . . . pressing tool
60 . . . pressing mechanism

The invention claimed is:

1. A method for producing a glass sheet with a bent portion, the glass sheet including a flattened portion and the bent portion continued to the flattened portion,
wherein a flat glass sheet is radiationally heated with a first portion of the flat glass sheet held between and in contact with first and second heat-insulating members and then a second portion of the flat glass sheet not held between the first and second heat-insulating members is bent while the first portion is held between and in contact with the first and second heat-insulating members,
wherein the flat glass sheet is heated by radiationally heating an entire region of the second portion until the first portion of the flat glass sheet reaches a temperature equal to or higher than a strain point of the flat glass sheet while the first portion is held between and in contact with the first and second heat-insulating members,
wherein the first and second heat-insulating members include a through hole and a coolant is fed through the through hole to control a temperature of the first and second heat-insulating members holding the first portion so as to avoid a temperature of the first portion from becoming above a softening point of the flat glass sheet, and
wherein the through hole is provided in an internal portion of the first and second heat-insulating members and is configured to direct coolant to the internal portion of the first and second heat-insulating members.

2. The method for producing a glass sheet with a bent portion according to claim 1, wherein the flat glass sheet is heated so that the second portion of the flat glass sheet reaches a higher temperature than the first portion thereof.

3. The method for producing a glass sheet with a bent portion according to claim 1, wherein the flat glass sheet used is a flat glass sheet having a linear coefficient of thermal expansion of $120 \times 10^{-7}/°$ C. or less at 30° C. to 380° C.

4. The method for producing a glass sheet with a bent portion according to claim 1, wherein the heat-insulating members have a lower thermal conductivity than the flat glass sheet.

5. The method for producing a glass sheet with a bent portion according to claim 1, wherein the heat-insulating members are formed of ceramic material.

6. The method for producing a glass sheet with a bent portion according to claim 1, wherein the second portion is bent with the flat glass sheet pressed by the first and second heat-insulating members.

7. The method for producing a glass sheet with a bent portion according to claim 1, wherein the flat glass sheet is heated by a heater disposed at a lateral side of the flat glass sheet.

* * * * *